United States Patent [19]

Sisler

[11] Patent Number: 5,010,641
[45] Date of Patent: Apr. 30, 1991

[54] METHOD OF MAKING MULTILAYER PRINTED CIRCUIT BOARD

[75] Inventor: John R. Sisler, Scott's Valley, Calif.

[73] Assignee: Unisys Corp. (Formerly Burroughs Corp.), Detroit, Mich.

[21] Appl. No.: 374,118

[22] Filed: Jun. 30, 1989

[51] Int. Cl.⁵ .............................................. H05K 3/36
[52] U.S. Cl. ....................................... 29/830; 29/846; 428/901
[58] Field of Search ................... 29/830, 846; 428/901; 174/261

[56] References Cited

U.S. PATENT DOCUMENTS

| | | | |
|---|---|---|---|
| 3,795,047 | 3/1974 | Abolafia et al. | 29/830 X |
| 3,798,762 | 3/1974 | Harris et al. | 29/846 |
| 4,180,608 | 12/1979 | Del | 29/846 X |
| 4,285,780 | 8/1981 | Schachter | 29/830 X |
| 4,526,835 | 7/1985 | Takahashi et al. | 428/901 X |
| 4,668,332 | 5/1987 | Ohnuki et al. | 29/846 X |
| 4,830,704 | 5/1989 | Voss et al. | 29/846 X |
| 4,868,350 | 9/1989 | Hoffarth et al. | 29/830 X |

FOREIGN PATENT DOCUMENTS 53-71267  6/1978  Japan ........................... 29/830

OTHER PUBLICATIONS

IBM Tech Discl. Bull., vol. 27, No. 5, Oct. 1984, pp. 2829-2830, by L. N. Chellis, et al.

Primary Examiner—Carl E. Hall
Assistant Examiner—C. J. Arbes
Attorney, Agent, or Firm—Nathan Cass; Mark T. Starr

[57] ABSTRACT

A method of making a multilayer printed circuit board providing sufficient internal distributed capacitance so as to eliminate the need for the by-pass capacitor conventionally provided in the vicinity of each integrated circuit mounted to the board. The method includes providing one or more fully-cured power-ground plane sandwich components which are laminated together with other partially cured component layers of the board. Each sandwich component comprises a conductive power plane layer and a conductive ground plane layer having a fully cured dielectric material therebetween. The thickness of the dielectric layer of each sandwich is chosen sufficiently thin to provide the desired distributed capacitance.

10 Claims, 2 Drawing Sheets

METHOD OF MAKING MULTILAYER PRINTED CIRCUIT BOARD

CROSS REFERENCE TO RELATED PATENT APPLICATION

This patent application is related to copending patent application Ser. No. 374,901, filed June 30, 1989 for MULTILAYER PRINTED CIRCUIT BOARD, JOHN SISLER, inventor.

BACKGROUND OF THE INVENTION

The present invention relates to improved means and methods for providing multilayer printed circuit boards, such as are commonly employed in digital computers.

Multilayer printed circuit boards are widely used in computer systems for providing interconnections between integrated circuit (IC) chips and other components. As is well known, a multilayer printed circuit board typically comprises a board having a plurality of insulated conductive trace layers, including outer and inner conductive trace layers and power and ground planes. Components such as integrated circuits (ICs) are typically mounted on the outer board surfaces and electrically connected to trace layers formed on one or both of the outer surfaces. Interconnections between inner and outer trace layers and to power and ground planes are typically provided using plated-through holes or "vias." Some examples of prior art multilayer printed circuit boards are described and shown in U.S. Pat. Nos. 4,328,531 and 4,560,962.

One of the problems associated with the use of multilayer printed circuit boards is that, during operation, the switching of ICs can cause high speed fluctuations in the voltage level between the power and ground planes. As a result, it is typical to provide a by-pass capacitor in the general vicinity of each IC connected between the power and ground planes in order to provide voltage stabilization. Besides the undesirability of having to provide such a by-pass capacitor in the general vicinity of each IC, this by-pass capacitor introduces its own problems, particularly at high frequencies. One reason is that, whether the capacitor is of the surface-mounted or through-hole type, its structure, and the necessary connection to power and ground planes through "vias" introduces a small amount of inductance which impedes the effectiveness of its by-passing action at high frequency thereby detracting from the voltage stabilization which can be provided between the power and ground planes at high frequencies. Furthermore, such high frequency noise is a primary source of radiated energy which increases the difficulty of meeting EMI requirements. Still further, these by-pass capacitors can typically constitute 40% to 50% of the parts installed on many boards, which can have a significant impact on scheduling, purchasing, stocking, inspection, assembly, testing, and production yields.

SUMMARY OF THE INVENTION

It is accordingly a broad object of the present invention to provide an improved method of making a multilayer printed circuit board.

Another object of the invention is to provide an improved method of making a multilayer printed circuit board having a construction which eliminates the need to provide by-pass capacitors for ICs mounted on the board.

A further object of the invention, in accordance with one or more of the foregoing objects, is to provide an improved method of making a multilayer printed circuit board having a plurality of spaced power-ground plane sandwiches.

In a particular preferred embodiment of the invention, the above objects are accomplished by providing a method of making a multilayer printed circuit board construction such that a plurality of fully-cured power-ground plane sandwich components are laminated together with other half-cured component layers of the board, wherein each power-ground plane sandwich component has a spacing and insulative dielectric material therebetween such that the resulting distributed capacitance provided thereby is sufficient to eliminate the need for the by-pass capacitors conventionally provided in the vicinity of the ICs mounted to the board.

The specific nature of the invention as well as other objects, features, advantages, and uses thereof will become evident from the following description of a preferred embodiment along with the accompanying drawings.

DESCRIPTION OF A PREFERRED EMBODIMENT

Like characters and numerals correspond to like elements throughout the figures of the drawings.

Figure 1:
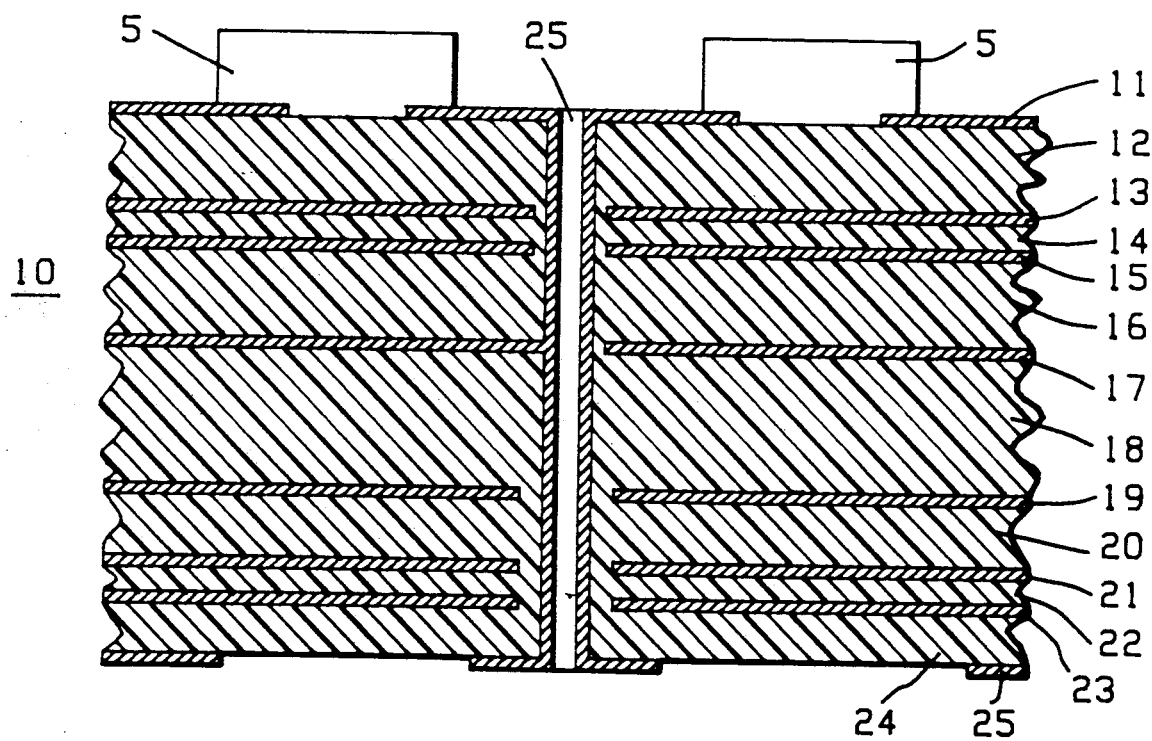
FIG. 1 is a cross-sectional view illustrating a preferred construction for a multilayer printed circuit board in accordance with the invention.

Reference is initially directed to the cross-sectional view of FIG. 1 which illustrates a multilayer printed circuit board structure 10 in accordance with the invention having ICs 5 mounted thereto in a conventional manner. The multilayer structure 10 is comprised of eight conductive layers 11, 13, 15, 17, 19, 21, 23, and 25 interleaved by respective insulative layers 12, 14, 16, 18, 20, 22, and 24. More specifically, conductive layers 11 and 25 are outer circuit traces and conductive layers 17 and 19 are inner circuit traces.

Still with reference to FIG. 1, conductive layers 13 and 15 are respectively power and ground planes which along with dielectric layer 14 therebetween constitute a first power-ground plane sandwich, and conductive layers 21 and 23 are respectively power and ground planes which along with dielectric layer 22 therebetween constitute a second power-ground plane sandwich.

FIG. 1 also shows how a plated-through hole 25 ("via") may typically be provided for electrically interconnecting a signal path 11a on outer circuit trace 11 to a signal path 17a of inner circuit trace 17. It is to be understood that the circuit traces 11, 17, 19, and 25 as well as plated-through holes ("vias") such as 25 may be provided in the structure 10 of FIG. 1 in a conventional manner. It is further to be understood that the widths and thicknesses of the various signal paths of the circuit traces 11, 17, 19, and 25 and their respective spacings from the power and ground planes 13, 15, and 21, 23 are chosen in a conventional manner so as to provide appropriate impedances and other desired circuit characteristics as disclosed, for example, in the aforementioned U.S. Pat. No. 4,560,962. Also, it will be understood that conductive patterns have to be provided on the power and ground planes 13, 15, and 21, 23, in order to provide non-conductive clearances for plated-through holes which pass therethrough without making electrical contact.

In accordance with the present invention, the respective dielectric layers 14 and 22 of power-ground plane sandwiches 13, 14, 15, and 21, 22, 23 are chosen such that these power-ground planes provide sufficient distributed capacitance to eliminate the need for the conventional by-pass capacitors which would otherwise have to be provided in the vicinity of each IC 5. The relationship governing the capacitance per-square-inch C obtained using such a power-ground plane is representable by the following equation:

$$C = (D)(E/t)$$

where E is the dielectric constant of the dielectric material t is the thickness in mils of the dielectric material between the power and ground planes, and D is a constant equal to 225 picofarad mil/inch$^2$.

For example, it was determined for a particular preferred embodiment that a capacitance C of at least 1,000 picofarads per square inch of printed circuit board would be necessary to eliminate having to provide the by-pass capacitors which would conventionally have to be provided in the vicinity of each IC. For a dielectric material having a value of E=4 and a thickness of 1.5 mil (0.0015 inch), the resulting capacitance would be $$C = (225)(4)/(1.5) = 600 \; picofarads/in^2$$

Since there are two power-ground sandwiches 13, 14, 15, and 21, 22, 23 in the embodiment of FIG. 1, and their capacitance is additive, the total resulting capacitance per-square-inch is 1200 picofarads/in$^2$, which achieves the desired capacitance required for the above example in order to permit eliminating the conventional by-pass capacitors which would otherwise be required.

In the particular preferred embodiment of the invention being considered, the insulative layers 12, 16, 20, and 24 are of epoxy glass with a thickness of about 0.004 inch (4 mils), the central dielectric layer 18 is also of epoxy glass with a thickness of about 15 mils (0.015 inch), and each of the circuit traces 11, 17, 19, and 25 as well as the power-ground layers 13, 15, and 21, 23 has a thickness of about 1.4 mils (0.0014 inch). The dielectric layers 14 and 22 of the power-ground sandwiches are likewise of epoxy glass (E=4), and each has a thickness of about 1.5 mils (0.0015 inch). This results in the two power-ground sandwiches 13, 14, 15, and 21, 22, 23 providing a distributed capacitance of about 1200 picofarads/in$^2$. Although materials having a higher dielectric constant could be used for the power-ground sandwich dielectric layers 14 and 22 in order to obtain greater capacitance, it is preferred to use the same epoxy glass as used for the other insulative layers 12, 16, 20, and 24. It is also most preferable that the thickness of the dielectric layers 14 and 22 be less than 2 mils.

In some situations, a relatively small number of mounted capacitors might have to be provided to improve the frequency response for lower frequencies (e.g. less than 20 MHz). At these lower frequencies, the location of these capacitors is not critical and they can be provided by relatively few, larger value capacitors distributed on a grid pattern, which for most printed circuit boards amounts to much fewer than one per IC. In the preferred embodiment considered above, such is provided using four 47 microfarad capacitors, and two 0.1 microfarad capacitors on an 11×14-inch board, which is only six capacitors.

Tests on the particular preferred embodiment exemplified above reveal that the high frequency response provided using the power-ground sandwiches 13, 14, 15, and 21, 22, 23 is twice as good as obtained when conventional surface mounted capacitors are used. Impedance measurements at frequencies above 100 MHz have shown that the inductance exhibited by the power-ground plane sandwiches is roughly one-half of that of 1000 picofarad surface mounted capacitors, thereby improving EMI characteristics. Furthermore, since the power-ground plane sandwiches provide a distributed capacitance, the potential impedance imbalance which can occur using surface mounted capacitors in discrete locations is prevented.

Figure 2:
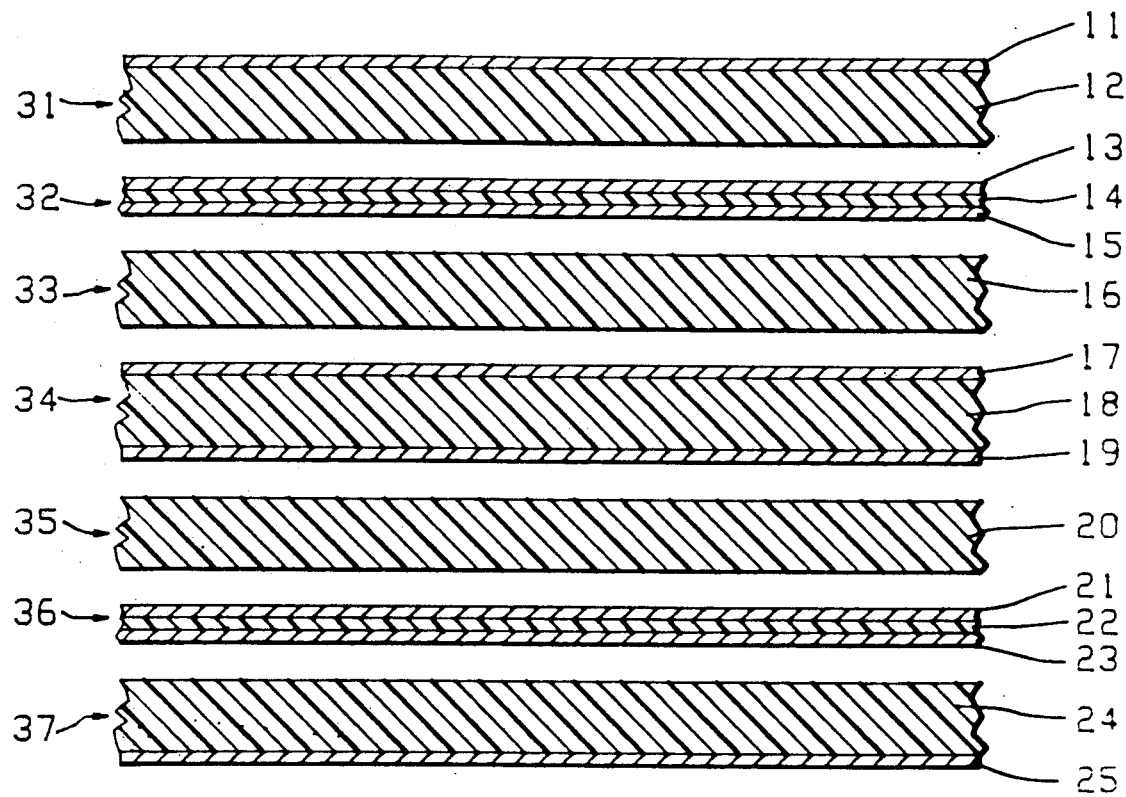
FIG. 2 is an exploded cross-sectional view illustrating a preferred method of making the multilayer printed circuit board shown in FIG. 1.

Reference is next directed to the exploded cross-sectional view of FIG. 2, which will be used to illustrate a preferred method of making the multilayer structure 10 of FIG. 1 for greater clarity, the trace layers 11, 17, 19, 21 as well as the power and ground layers 13, 15, and 21, 23 in FIG. 2 are shown as being continuous in the illustrated cross-section. Also, no plated-through holes or "vias" are shown in FIG. 2.

FIG. 2 illustrates, in exploded fashion, seven separate components 31, 32, 33, 34, 35, 36, 37, which are laminated together using conventional lamination techniques to form the multilayer structure 10 shown in FIG. 1. Component 31 comprises the dielectric 12 having the trace 11 on its upper surface, component 32 comprises the upper power-ground plane sandwich 13, 14, 15 in FIG. 1, component 33 comprises the dielectric layer 16, component 34 comprises the central dielectric layer 18 having the traces 17 and 19 on its outer surfaces, component 35 comprises the dielectric layer 20, component 36 comprises the second power-ground plane sandwich 21, 22, 23, and component 37 comprise the dielectric 24 having the trace 25 on its lower surface.

Except for the dielectric layers 14 and 22 of the power-ground plane sandwiches 13, 14, 15, and 21, 22, 23, all of the other dielectric layers 12, 16, 18, 20, 24 shown in FIG. 2 are in the half-cured state, and are completely cured during the conventional lamination which is performed to form the multilayer structure 10 shown in FIG. 1.

The manner in which each of the power-ground plane sandwich components 32 and 36 is provided will now be considered in more detail. Unlike the dielectric layers of the other components, each of the power-ground plane sandwiches 13, 14, 15, and 21, 22, 23 is initially provided with its respective dielectric 14 or 22 in a completely cured state without any patterns being provided on its respective outer layers 13, 15, or 21, 23.

The patterns required for the power and ground planes 13, 15, and 21, 23 are formed on the completely cured epoxy dielectric 14 or 22, such as by etching the outer conductive layers in a conventional manner. This produces an acceptably stiff power-ground plane sandwich, even though the dielectric (14 or 22) is very thin (for example, 1.5 mils), and also eliminates possible cavitation problems that can occur when the assembly is laminated with the other layers shown in FIG. 2. Another advantage is that the resulting power-ground plane sandwiches 13, 14, 15, and 21, 22, 23 can be handled in the printed board shop without special care using the same techniques and equipment used for other components.

Although the above description has been directed to particular preferred embodiments, it is to be understood that the invention is subject to a wide variety of modifications without departing from the scope to which the inventor is entitled. Accordingly, the invention is to be considered as encompassing all modifications and variations coming within the scope of the appended claims.

What is claimed is:

1. A method of making a multilayer printed circuit board comprised of interleaved contiguous conductive and insulative dielectric layers, said method comprising:
   providing a power-ground plane sandwich component comprised of a curable dielectric layer contiguously sandwiched between a conductive power plane layer and a conductive ground plane layer;
   fully curing the dielectric layer of said sandwich component;
   providing a single-trace component comprised of a circuit trace formed on a partially cured dielectric layer; assembling said components such that one side of said sandwich component is adjacent to and contiguous with the dielectric layer of said single-trace component; and
   laminating said components to form said board, the dielectric layer of said single-trace component becoming fully cured by said laminating.

2. A method of making a multilayer printed circuit board comprised of interleaved contiguous conductive and insulative dielectric layers, said method comprising:
   providing a power-ground plane sandwich component comprised of a curable dielectric layer contiguously sandwiched between a conductive power plane layer and a conductive ground plane layer;
   fully curing the dielectric layer of said sandwich component;
   providing a double-trace component comprised of a partially cured dielectric layer having a circuit trace formed on both sides thereof;
   providing an insulating layer component comprised of a partially cured dielectric layer;
   assembling said components such that said insulating layer component is between said sandwich component and said double-trace component; and
   laminating said components to form said board, said partially cured dielectric layers becoming fully cured by said laminating.

3. The invention in accordance with claim 2, wherein said method includes additionally providing a single-trace component comprised of a circuit trace formed on a partially cured dielectric layer, said assembling being such that the dielectric layer of said single trace component is adjacent to and contiguous with the other side of said sandwich component.

4. The invention in accordance with claim 1, 2, or 3, wherein a pattern is required to be formed on one of the ground and power planes of said sandwich component, and wherein said method comprises forming said pattern on the dielectric layer of said sandwich after it has been fully cured.

5. A method of making a multilayer printed circuit board comprised of interleaved contiguous conductive and insulative dielectric layers, said method comprising:
   providing a plurality of power-ground plane sandwich components each comprised of a curable dielectric layer contiguously sandwiched between a conductive power plane layer and a conductive ground plane layer;
   fully curing the dielectric layer of each sandwich component;
   forming patterns in said power and ground planes after their respective dielectric layers are fully cured;
   providing additional components comprised of one or more layers required by said board, certain ones of said layers comprising partially cured dielectric material;
   assembling said components such that said power-ground plane sandwiches are at spaced internal positions within the multilayer board; and
   laminating said components to form said board, said partially cured dielectric material becoming fully cured by said laminating.

6. A method of making a multilayer printed circuit board comprised of interleaved contiguous conductive and insulative dielectric layers, said method comprising:
   providing first and second power-ground plane sandwich components each comprised of a curable dielectric layer contiguously sandwiched between a conductive power plane layer and a conductive ground plane layer;
   curing the dielectric layer of each sandwich component;
   forming patterns in said power and ground planes after their respective dielectric layers are fully cured;
   providing first and second single-trace components each comprised of a circuit trace formed on a partially cured dielectric layer;
   providing a double-trace component comprised of a partially cured dielectric layer having a circuit trace formed on both sides thereof;
   providing first and second insulating layer components each comprised of a partially cured dielectric layer;
   assembling said components such that said first and second single-trace components are respectively located at the upper and lower ends of said board with their respective circuit traces outward and their respective dielectric layers inward, said first sandwich is located with one side adjacent to and contiguous with the dielectric layer of said first single-trace component, said second sandwich is located with one side adjacent to and contiguous with the dielectric layer of said second single-trace component, said first insulating layer component is contiguously located between the other side of said first sandwich and one side of said double-trace component, and said second insulating component is contiguously located between the other side of said second sandwich and the other side of said double-trace components; and
   laminating said components to form said board, said partially cured dielectric layers becoming fully cured by said laminating.

7. The invention in accordance with claim 1, 2, 3, 5, or 6, wherein said method includes the step of mounting integrated circuits to said board.

8. The invention in accordance with claim 1, 2, 3, 5, or 6, wherein the dielectric layer of said sandwich component has a thickness of less than 2 mils.

9. The invention in accordance with claim 8, wherein the dielectric layer of said sandwich component has a thickness of approximately 1.5 mils.

10. The invention in accordance with claim 1, 2, 3, 5, or 6, wherein said dielectric layers are of epoxy glass material.

* * * * *